US008895335B1

(12) United States Patent
Wierer, Jr. et al.

(10) Patent No.: US 8,895,335 B1
(45) Date of Patent: Nov. 25, 2014

(54) IMPURITY-INDUCED DISORDER IN III-NITRIDE MATERIALS AND DEVICES

(75) Inventors: Jonathan J. Wierer, Jr., Albuquerque, NM (US); Andrew A. Allerman, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 38 days.

(21) Appl. No.: 13/558,516

(22) Filed: Jul. 26, 2012

Related U.S. Application Data

(60) Provisional application No. 61/513,924, filed on Aug. 1, 2011.

(51) Int. Cl.
*H01L 21/20* (2006.01)
*H01L 21/44* (2006.01)

(52) U.S. Cl.
USPC ............. 438/45; 438/561; 438/478; 438/483; 257/61; 257/66; 257/E21.09; 257/E29.003; 257/E29.091; 372/44.01; 385/144

(58) Field of Classification Search
CPC ................... H01L 21/02381; H01L 21/02433; H01L 21/02609; H01L 21/0254; H01L 21/02458; H01L 21/02389; H01L 21/02658; H01L 21/0262; H01S 5/0095; H01S 5/22; H01S 5/0201; H01S 5/3202; H01S 5/34333; H01S 5/00; H01S 5/2201; H01S 5/2009; B82Y 5/00
USPC ............... 438/45, 4, 561, 301, 174, 251, 478, 438/463, 483, 487, 767, 914; 257/61, 66, 257/94, 615, 101, 483, E23.148, E31.019, 257/E31.015, E33.01, E33.017, E33.023, 257/E23.15, E21.11, E21.134, E29.003, 257/E29.091; 372/44.01
See application file for complete search history.

(56) References Cited

U.S. PATENT DOCUMENTS

| 2005/0142682 A1* | 6/2005 | Ishibashi et al. ................ 438/45 |
| 2006/0165143 A1* | 7/2006 | Ohno ........................ 372/46.015 |
| 2013/0020682 A1* | 1/2013 | Clark et al. .................... 257/616 |

OTHER PUBLICATIONS

W.D. Laidig, et al., Disorder of an AlAs—GaAs Superlattice by Impurity Diffusion, Appl. Phys. Lett. 38 (10), May 15, 1981, pp. 776-778.
D.G. Deppe, et al., Impurity Diffusion and Layer Interdiffusion in AlxGa1—xAs—GaAs Heterostructures, J. Appl. Phys. 64(4), Aug. 15, 1998, pp. 1838-1844.
D.G. Deppe et al., Impurity-Induced Layer Disordering of High Gap Iny(AlxGa1—x)1-yP Heterostructures, Appl. Phys. Lett. 52(17),Apr. 25, 1988, pp. 1413-1415.
L.L. Chang and A. Koma, Interdiffusion between GaAs and AlAs, Applied Physics Letters, vol. 29, No. 3, Aug. 1, 1976, pp. 138-141.
K. Meehan, et al., Impurity-Induced Disordering of Single Well AlxGa1—xAs—GaAs Quantum Well Heterostructures, Appl. Phys. Lett. 44(4), Feb. 15, 1984, pp. 428-430.
S. Porowski et al., Annealing of GaN under High Pressure of Nitrogen, J. Phys.: Condens. Matter 14 (2002), pp. 11097-11110.

(Continued)

*Primary Examiner* — Wensing Kuo
*Assistant Examiner* — Moazzam Hossain
(74) *Attorney, Agent, or Firm* — Kevin W. Bieg

(57) ABSTRACT

A method for impurity-induced disordering in III-nitride materials comprises growing a III-nitride heterostructure at a growth temperature and doping the heterostructure layers with a dopant during or after the growth of the heterostructure and post-growth annealing of the heterostructure. The post-growth annealing temperature can be sufficiently high to induce disorder of the heterostructure layer interfaces.

11 Claims, 7 Drawing Sheets

(56) References Cited

OTHER PUBLICATIONS

A.Y. Polyakov, et al., Optical Properties of Undoped n-AlGaN/GaN Superlattices as Affected by Built-In and External-Electric Field and by Ar-Implantation-Induced Partial Disordering, Journal of Electronic Materials, vol. 31, No. 5, 2002, pp. 384-390.

M.D. McCluskey, et al., Disordering of InGaN/GaN Superlattices after High-Pressure Annealing, MRS Internet J. Nitride Semicond. Res. 4S1, G3.42 (1999), 6 pages.

Michael C.Y. Chan, et al., Thermal Annealing of InGaN/GaN Strained-Layer Quantum Well, MRS Internet J. Nitride Semicond. Res. 4S1, G6.25 (1999), 6 pages.

N. Iizuka, et al., Sub-Picosecond All-Optical Gate Utilizing aN Intersubband Transition, Optics Express, vol. 13, No. 10, May 16, 2005, pp. 3835-3840.

Daniel Hofstetter, et al., GaN/AlN-Based Quantum-Well Infrared Photodetector for 1.55 μm, Applied Physics Letters, vol. 83, No. 3, Jul. 21, 2003, pp. 572-574.

Claire Gmachl, et al., Intersubband Absorption in GaN/AlGaN Multiple Quantum Wells in the Wavelength Range of λ~1.75-4.2 μm, Applied Physics Letters, vol. 77, No. 3, Jul. 17, 2000, pp. 334-336.

S. Nicolay, et al., Indium Surfactant Effect on AlN/GaN Heterostructures Grown by Metal-Organic Vapor-Phase Epitaxy: Applications to Intersubband Transitions, Applied Physics Letters 88, 151902 (2006), pp. 151902-1-151902-3.

Jung-Seung Yang, et al., Blueshift of Intersubband Transition Wavelength in AlN/GaN Multiple Quantum Wells by Low Temperature Metal Organic Vapor Phase Epitaxy using Pulse Injection Method, Applied Physics Letters 95, 16211 (2009), pp. 1622111-1-162111-3.

\* cited by examiner

IMPURITY-INDUCED DISORDER IN III-NITRIDE MATERIALS AND DEVICES

CROSS-REFERENCE TO RELATED APPLICATION

This application claims the benefit of U.S. Provisional Application No. 61/513,924, filed Aug. 1, 2011, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to layer intermixing in heterostructure semiconductor materials and, in particular, to impurity-induced disorder in III-nitride semiconductor materials and devices.

BACKGROUND OF THE INVENTION

Impurity-induced layer disordering (IILD) or layer intermixing is a well studied phenomena in the III-arsenide and III-phosphide material systems, but has not been conclusively identified in III-nitride materials. See W. D. Laidig et al., *Appl. Phys. Lett.* 38, 776 (1981); D. G. Deppe and N. Holonyak, Jr., *J. Appl. Phys.* 64, R93 (1988); and D. G. Deppe et al., *Appl. Phys. Lett.* 52, 1413 (1988). Normally an unintentionally doped (UID) heterointerface such as an AlAs/GaAs is stable (no Al—Ga interdiffusion) up to high temperatures (~900° C.). See L. L. Chang and A. Koma, *Appl. Phys. Lett.* 29, 138 (1976). The introduction of impurities by diffusion, implantation, or during growth lowers the temperature where layer disordering can occur (~500° C. for Zn in III-As). See W. D. Laidig et al., *Appl. Phys. Lett.* 38, 776 (1981). Beyond the obvious materials science interests, layer disordering has many practical uses in device fabrication by using selective layer disordering for carrier and photon confinement. See K. Meehan et al., *Appl. Phys. Lett.* 44, 428 (1984).

III-nitrides are believed to be stable under standard growth and processing temperatures, because of the high crystal bond strength and low diffusivity of impurities. Layer intermixing in GaN/AlGaN heterostructures with no impurities is observed at temperatures of ~1500° C. See S. Porowski et al., *J. Phys., Condens. Matter.* 14, 11097 (2002). Other reports of layer disordering of III-nitrides claim only localized intermixing in AlGaN/GaN observed at line defects, or with InGaN/GaN heterostructures at temperatures much higher than the InGaN growth temperature making it unclear if an impurity-induced layer disordering process is occurring. See A. Y. Polyakov et al., *J. Elec. Mat.* 31, 384 (2002); M. D. McCluskey et al., *MRS Internet J. Nitride Semicond. Res.* 4S1, G3.42 (1999); and M. C. Y. Chan et al., *MRS Internet J. Nitride Semicond. Res.* 4S1, G6.25 (1999).

There is continued interest in using the large conduction band offsets (~2 eV) of AlGaN-based heterostructures to create superlattice (SL) structures with near-infrared intersubband energy transitions for devices such as optical switches and detectors. See N. Iizuka et al., *Optics Express* 13, 3835 (2005); and D. Hofstetter et al., *Appl. Phys. Lett.* 83, 572 (2003). Typically these heavily doped AlGaN heterostructures are grown by molecular beam epitaxy (MBE) to achieve the abrupt interfaces in thin (<50 Å) well layers required to achieve short wavelength and narrow intersubband energy transitions. See C. Gmachl et al., *Appl. Phys. Lett.* 77, 334 (2000). Recently, progress has been made to improve heterointerface abruptness in metal-organic vapor phase epitaxy (MOVPE) grown III-nitride intersubband. Nicoly et al. claims reduced layer roughness in GaN/Al(In)N SLs by altering the interface surface during growth using indium as a surfactant. See S. Nicolay et al., *Appl. Phys. Lett.* 88, 151902 (2006). Yang et al. states layer interdiffusion is caused simply by higher growth temperatures and suggests a possible role of gas phase reactions while not identifying high Si doping and thus IILD as a possibility. See J.-S. Yang et al., *Appl. Phys. Lett.* 95, 162111 (2009).

However, a need remains for a method of layer intermixing in the III-nitride material systems.

SUMMARY OF THE INVENTION

The present invention is directed to a method of impurity-induced disordering in III-nitride materials and devices made therewith. A method for impurity-induced layer disordering in III-nitride materials can comprise growing a III-nitride heterostructure at a growth temperature chosen to prevent layer disordering, doping the heterostructure layers with an impurity during growth, and post-growth annealing the heterostructure at an annealing temperature, time, and carrier gas pressure that induces disorder of the heterostructure layer interfaces. A dielectric layer, such as SiN, SiON, or $SiO_2$, can be deposited on a portion of the surface of the heterostructure prior to the post-growth annealing. The heterostructure can be selectively disordered when the post-growth annealing conditions promote layer disordering in the portions of the heterostructure without the dielectric overlayer and the portions of the heterostructure covered by the dielectric layer are prevented from layer disordering. Alternatively, the heterostructure can be selectively disordered when the post-growth annealing conditions prevents layer disordering in the portions of the heterostructure without the dielectric layer of the heterostructure and the disordering is promoted in those portions covered by the dielectric layer.

Alternatively, the method can comprise growing a III-nitride heterostructure without an impurity to prevent layer disordering to occur during growth, introducing a doping the heterostructure with an impurity after growth, and post-growth annealing the heterostructure at an annealing temperature, time, and carrier gas pressure that induces disorder of the heterostructure layer interfaces. For example, the doping can comprise ion implantation. For example, the doping can comprise depositing an impurity layer on the heterostructure surface, and post-growth annealing the heterostructure at an annealing temperature, thereby diffusing the impurity into the heterostructure. A portion of the surface of the heterostructure can be covered by a dopant-blocking layer, such as SiN, SiON, $SiO_2$, or photoresist, after growing to prevent doping a portion of the heterostructure. The heterostructure can thereby be selectively disordered when the post-growth annealing conditions promotes layer disordering of the heterostructure in the portions not covered by the dopant-blocking layer and the layers under the dopant-blocking layer are prevented from layer disordering.

The heterostructure can be grown by, for example, metal-organic vapor phase epitaxy, molecular beam epitaxy, or vapor phase epitaxy. The III-nitride heterostructure can comprise a plurality of AlGaN/AlN, GaN/AlN, GaN/AlGaN, InGaN/GaN, InGaN/AlN, InGaN/AlGaN, AlInN/GaN, AlInN/AlN, or AlInN/InGaN layers. Although many impurities can be used, the impurity can comprise, for example, silicon, magnesium, selenium, or tellurium. The preferred dopant concentration will also depend on the particular III-nitride heterostructure system and impurity, but can typically be greater than $5 \times 10^{19}$ cm$^{-3}$. The growth and post-growth annealing temperatures will depend on the particular III-nitride heterostructure system. However, the growth temperature can typically be less than 885° C. The post-growth annealing temperature can typically be greater than 700° C. and, more typically, can be greater than 1000° C. The carrier gas can be, for example, $N_2$, $NH_3$, $H_2$, or He.

The heterostructure can form one or more energy wells with defined energy levels in the conduction and valance band and disordering of the layers can shift the energy levels such that the energy separation of electron levels within the conduction band is less. Alternatively, the disordering of the layers can shift the energy levels such that the energy separation of electron levels within the conduction band and the holes in the valance band is larger.

The method can be used to create devices, such as optical waveguides, light-emitting diodes, photodetectors, solar cells, modulators, laser, and amplifiers. For example, an optical waveguide can comprise a waveguide layer comprising a III-nitride heterostructure and at least one cladding layer on the waveguide layer, the cladding layer comprising a III-nitride heterostructure that is disordered to provide a higher optical index than the waveguide layer. For example, III-nitride laser can comprise a facet end that is impurity-induced layer disordered.

As an example of the present invention, impurity-induced layer disordering was demonstrated in $Al_{0.1}Ga_{0.9}N$/AlN superlattices grown by metalorganic chemical-vapor deposition. During growth at temperatures as low as 885° C. and under post-growth annealing at 1000° C. in $N_2$ the heterointerfaces of Si-doped (Si concentration $>8 \times 10^{19}$ cm$^{-3}$) superlattices exhibit layer disordering (intermixing) while the unintentionally doped superlattices remain stable. Shifts in the intersubband energy transitions and scanning transmission electron microscope images showing changes in the layer abruptness were used to verify layer disordering due to Si diffusion in $Al_{0.1}Ga_{0.9}N$/AlN superlattices.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

This invention is directed to impurity-induced disorder in III-nitride materials. Impurity-induced layer disordering in MOVPE grown $Al_{0.1}Ga_{0.9}N$/AlN intersubband structures with high Si concentrations ([Si]$>8 \times 10^{19}$ cm$^{-3}$) is described below as an example of the present invention. Si doped and UID $Al_{0.1}Ga_{0.9}N$/AlN SLs was grown at temperatures ranging from 760° C.-1010° C. and subject to post-growth annealing. Shifts in the intersubband energy transitions and changes in the layer abruptness via scanning transmission electron microscope (STEM) images are observed. UID SLs are essentially stable while Si-doped SLs exhibit significant layer disordering, verifying IILD in AlGaN/AlN heterostructures via diffusion of the Si impurity at temperatures as low as 885° C.

The $Al_{0.1}Ga_{0.9}N$/AlN superlattices were grown by MOVPE in a Veeco D125 reactor at 75 torr using $H_2$ and $N_2$ as the carrier gas. Trimethylgallium, trimethylaluminum, and ammonia, were used to grow the $Al_xGa_{1-x}N$ alloys, and silane was used as the Si dopant source. Superlattices were grown using conventional, non-pulsed, MOVPE process on 2 μm thick AlN template layers with dislocation densities of ~$3 \times 10^9$ cm$^{-2}$, previously grown on (0001) c-plane sapphire substrates mis-oriented 0.2° toward the m-plane. All samples consisted of 20 period superlattices with layer thicknesses of ~13 Å (±1 Å) and 50 Å (±5 Å) for the $Al_{0.1}Ga_{0.9}N$ and AlN layers, respectively. The structures were capped by ~20 nm of AlN. UID and Si-doped superlattices were grown at temperatures ranging from 760° C.-1010° C. and completed in 66 to 88 minutes. The change in growth time reflected the decrease in growth rate of the $Al_{0.1}Ga_{0.9}N$ layer as the growth temperature was raised. The Si doping was limited to the $Al_{0.1}Ga_{0.9}N$ layers and the Si concentration varied from 8-15$\times 10^{19}$ cm$^{-3}$ measured in separate calibration layers by secondary ion mass spectrometry.

To measure the intersubband optical energy transitions waveguides were made by polishing 45° facets on ~5 mm wide samples. Then using a Fourier transform infrared spectrometer the white light transmission through the sample for transverse electric (TE) and transverse magnetic (TM) light was measured. The cross-section STEM samples were prepared by first thinning to ~100 nm using 30 keV focused Ga ion beam, and then further thinning to ~60 nm using 5 keV ion beam to remove the ion beam damage from the previous step. A JOEL 2010F was used to image the samples under STEM mode.

Figure 1:
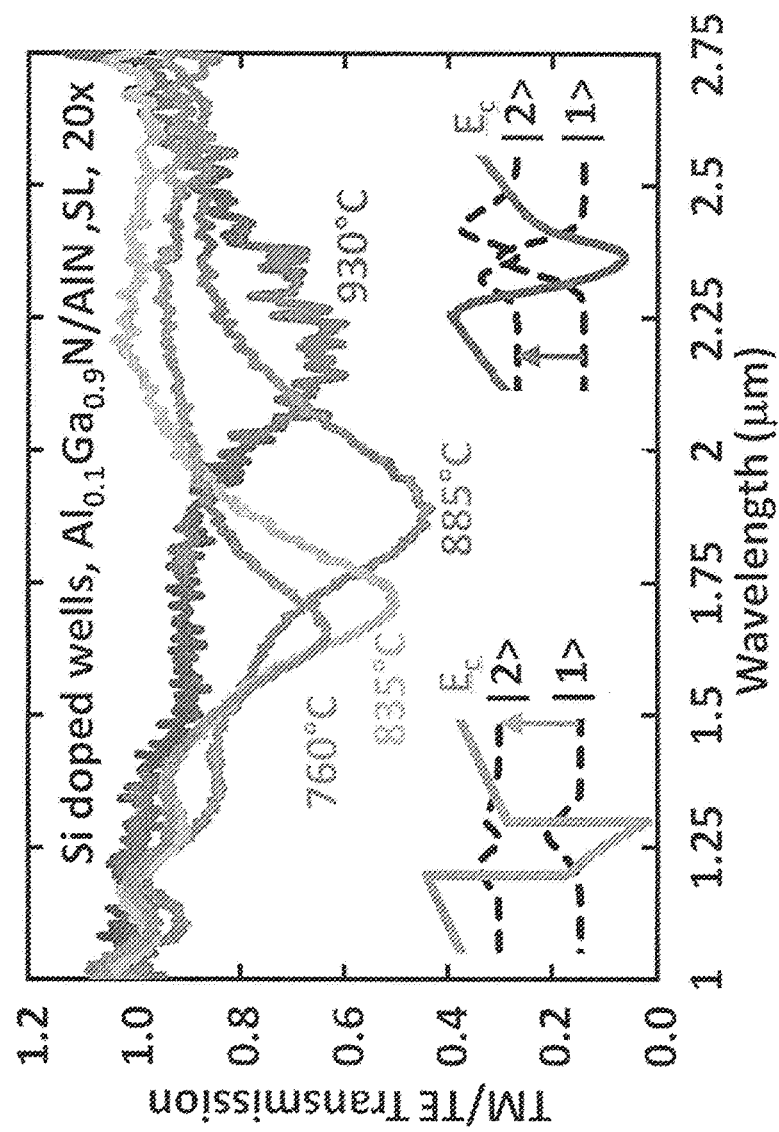
FIG. 1 is a graph of the ratio of transverse magnetic (TM) and transverse electric (TE) light transmission versus wavelength of $Al_{0.1}Ga_{0.9}N$/AlN superlattices grown at 760° C., 835° C., 885° C., and 930° C. The energy transition shifts with increased growth temperature. Insets show conduction band diagrams and energy levels for abrupt (left) and disordered (right) heterointerfaces illustrating energy shifts.

FIG. 1 shows the intersubband energy transition for four Si-doped SL samples grown at different temperatures by plotting the ratio of light transmission for TM and TE light versus wavelength (intersubband transitions are TM polarized only). The intersubband transition (largest minima) shifts to longer wavelengths (smaller energies) as the growth temperature is increased. No intersubband absorption is observed with a sample grown at 1010° C. The oscillations at shorter wavelengths are due to air-AlGaN-sapphire cavity interference. This is similar to the data from Yang et al. except the samples grown in FIG. 1 have $Al_{0.1}Ga_{0.9}N$ wells, and are grown using a conventional MOVPE process without sequential pulsing of the alkyl sources. The SLs grown below 885° C. have near state-of-the-art performance for intersubband energy transitions with the SL grown at 835° C. displaying full width at half maximum (FWHM) of ~120 meV, consistent with abrupt interfaces.

Disordering of layer interfaces provides an explanation of the energy shift with temperature displayed in the SLs grown at 885° C. and above. The modeled conduction band plots in the insets of FIG. 1 show as the heterointerfaces change from abrupt to graded (disordered) the intersubband energy transitions shift to smaller energies. Further supporting layer disordering in the Si-doped SLs is X-ray diffraction omega 2-theta scans about the (0002) reflection. The SL satellite peaks at the low growth temperatures of 760° C. and 835° C. span from −6 to +4, while at high temperatures of 1010° C. they span from −4 to +1 (data not shown). This decrease in SL satellite peaks suggests less abrupt interfaces.

Figure 2:
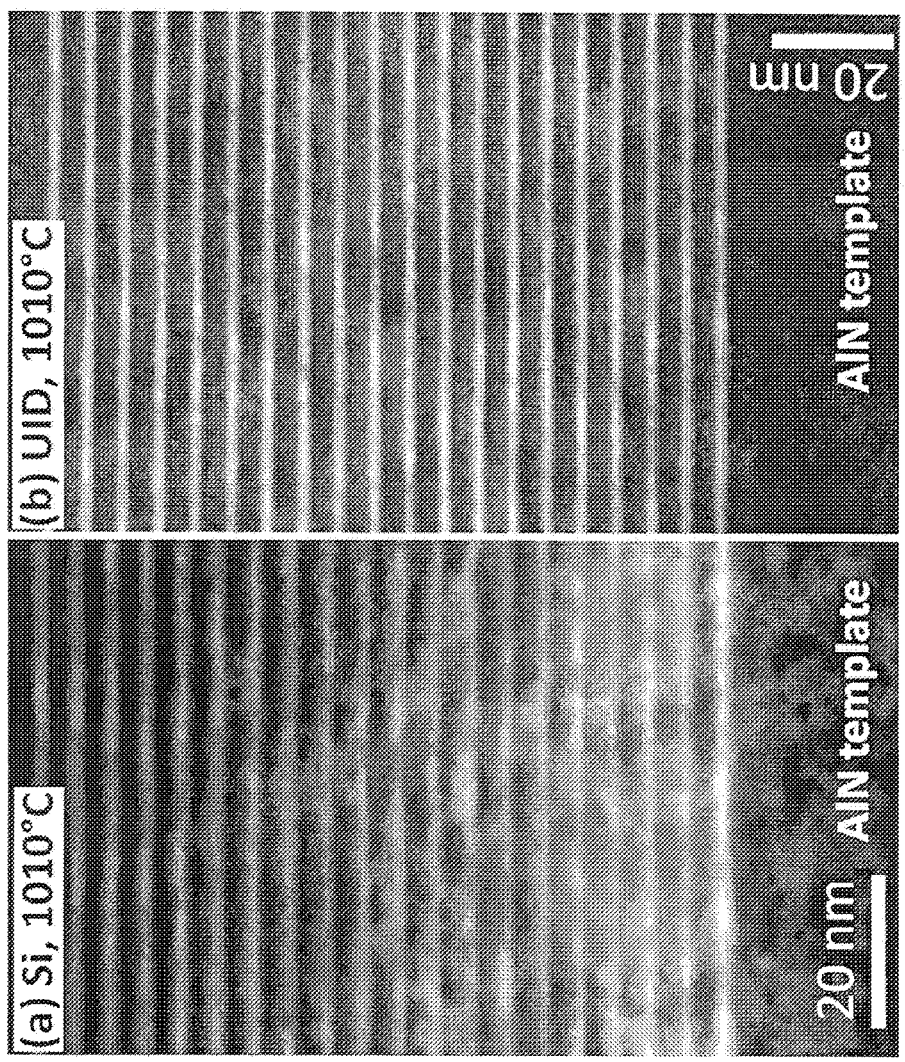
FIG. 2 shows scanning transmission electron microscope images of a (a) disordered Si-doped $Al_{0.1}Ga_{0.9}N$/AlN superlattice and a (b) stable UID superlattice both grown at 1010° C.

To confirm layer disordering is occurring in the high Si concentration SLs, STEMs were performed on equivalently grown SL samples at 1010° C., except one is Si-doped (FIG. 2a) and the other is UID (FIG. 2b). The STEM images show less contrast between layers in the Si-doped SL compared to the UID SL. The reduced contrast between SL layers is due to intermixing of group-III elements across the $Al_{0.1}Ga_{0.9}N$/AlN heterointerfaces and is correlated with the presence of heavy Si doping. Thus impurity-induced layer disordering is occurring, a mechanism previously reported only in III-arsenide and III-phosphide heterostructures. Furthermore, the STEM image of the Si-doped sample shows the layers grown first (i.e. closest to the substrate) exhibit the least amount of contrast and hence the greatest degree of intermixing as these layers experience the longest times at growth temperature. This change in abruptness across the SL is consistent with the increased absorption FWHM with increased temperature observed in FIG. 1.

Figure 3:
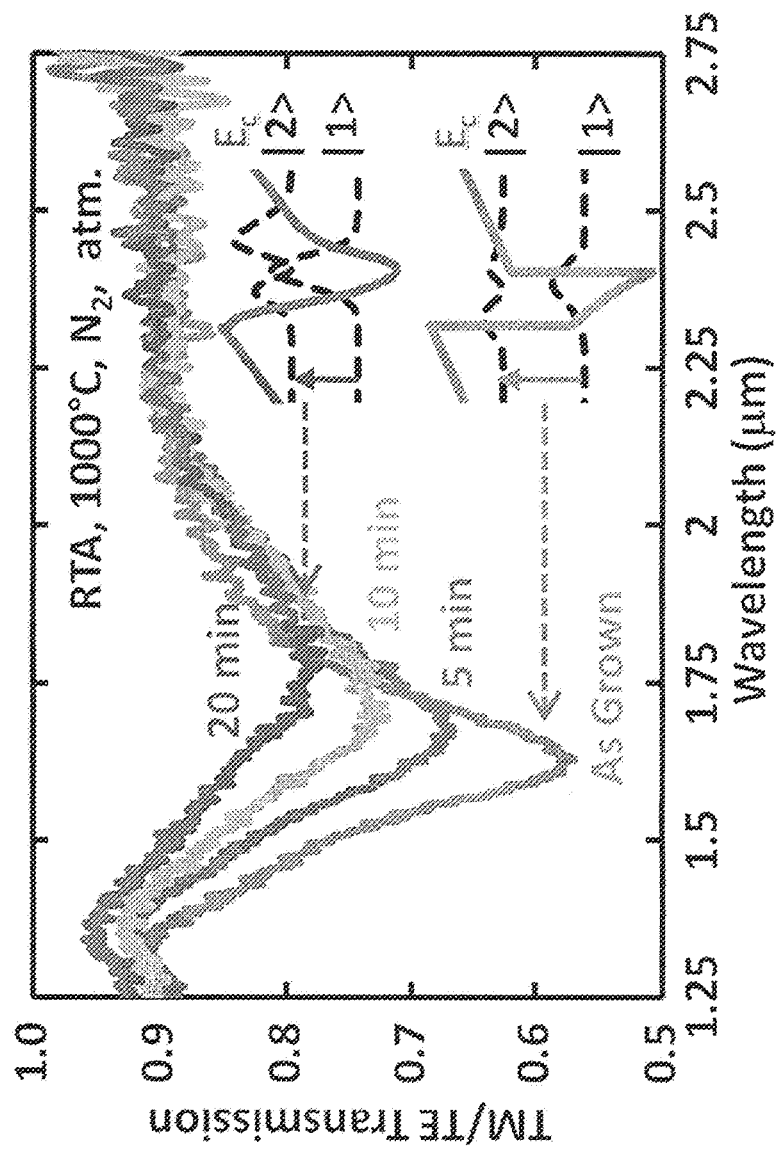
FIG. 3 is a graph of the ratio of transverse magnetic (TM) and transverse electric (TE) light transmission versus wavelength of an $Al_{0.1}Ga_{0.9}N$/AlN superlattice grown at 835° C. and annealed in an RTA for 5, 10, and 20 minutes. The energy transition shifts with anneal time.

Impurity-induced layer disordering in Si-doped AlGaN/AlN SLs is not a surface phenomenon occurring during growth, but is a solid-state process as layer disordering can also be observed with post-growth annealing. FIG. 3 shows the intersubband energy transitions of a Si-doped SL sample grown at 835° C. and annealed in a rapid thermal annealer (RTA) at 1000° C., under atmospheric pressure in $N_2$. The annealing times are 5, 10 and 20 min. The intersubband transition shifts to longer wavelengths (smaller energies) and become broader with increased anneal times. This red-shift and broadening is consistent with a loss of interface abruptness as observed in Si-doped SLs grown at higher temperatures. Additionally, the absorption strength reduces with increased annealing times suggesting Si diffusion. As the Si diffuses out of the AlGaN wells to the UID AlN barriers the Fermi level lowers and fewer electrons are available for the intersubband transition. The energy shift is less in post-growth annealed SLs (FIG. 3) compared to high temperature as grown SLs (FIG. 1). The degree of impurity diffusion and layer disordering is influenced by the choice of ambient gases and overpressures as demonstrated in III-arsenide materials, and these conditional changes are also expected to affect III-nitrides. See D. G. Deppe and N. Holonyak, Jr., *J. Appl. Phys.* 64, R93 (1988). IILD in III-nitrides can also be affected by different gases ($N_2$ vs. $NH_3$), overpressures, and vacancies.

Figure 4:
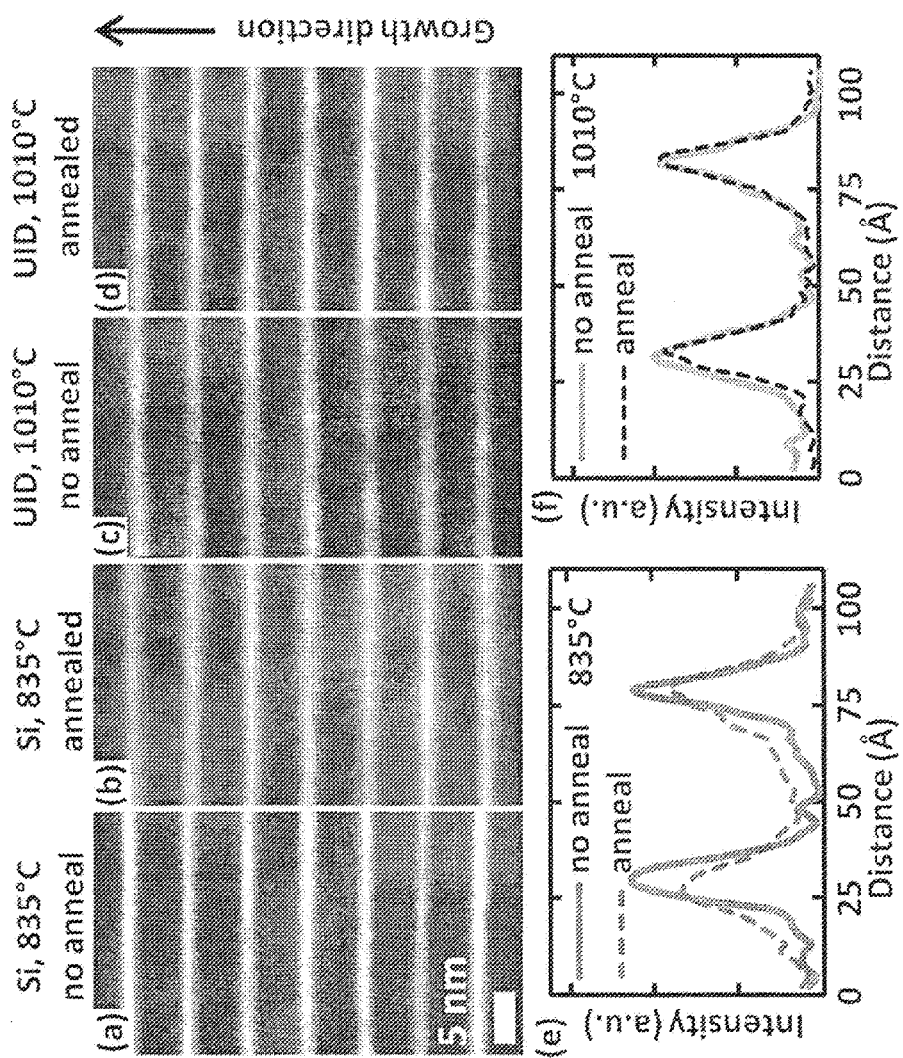
FIG. 4 shows scanning transmission electron microscope images of the first seven periods of a Si-doped superlattice grown at 835° C. (a) before and (b) after annealing at 1000° C., and an UID superlattice grown at 1010° C. (c) before and (d) after annealing at 1000° C. Intensity line-scans of two periods of the (e) 835° C. SL and the (f) 1010° C. SL before and after anneal. The Si-doped SL is disordered while the UID SL is stable.

FIG. 4 shows STEM images of the first seven periods of a Si-doped SL grown at 835° C. and an UID SL grown at 1010° C. before and after RTA annealing at 1000° C. for 20 min. The SL grown at 835° C. has sharp interfaces before annealing (FIG. 4a) becoming less abrupt after annealing (FIG. 4b). Conversely, little change is observed in interfaces with annealing in the UID SL grown at 1010° C. (FIGS. 4c and 4d). Intensity line-scans of the STEM images for the 835° C. SL before and after anneal (FIG. 4e) show a ~25% reducing in the contrast of the AlN to $Al_{0.1}Ga_{0.9}N$ layers, and a wider FWHM after anneal. Intensity line scans of the SL grown at 1010° C. before and after anneal (FIG. 4f) show only a ~5% reduction in contrast in the $Al_{0.1}Ga_{0.9}N$—AlN layers, where 5% is within the statistical error of the measurement, and no widening of the well intensity. This data clearly shows the high concentration Si impurity is required for layer disordering to occur. The heterointerfaces of the SL grown at 835° C. (FIG. 4a) appear somewhat sharper than those in the sample grown at 1010° C. (FIG. 4c). It is possible mechanisms such as vacancy-induced disordering, gas-phase parasitic reactions or degradation of reactor flow dynamics cause this slight grading. These possible mechanisms are secondary to the Si-induced layer disordering.

Impurity-induced layer disordering in AlGaN/AlN heterostructures is described above as an example of the present invention. UID $Al_{0.1}Ga_{0.9}N$/AlN heterointerfaces are stable up to 1010° C., while the highly Si-doped $Al_{0.1}Ga_{0.9}N$/AlN heterointerfaces exhibit layer disordering during growth at temperatures as low as 885° C. and under post-growth annealing at 1000° C. IILD is not limited to AlGaN/AlN heterostructures, but can be present in all III-nitride alloys.

Figure 5:
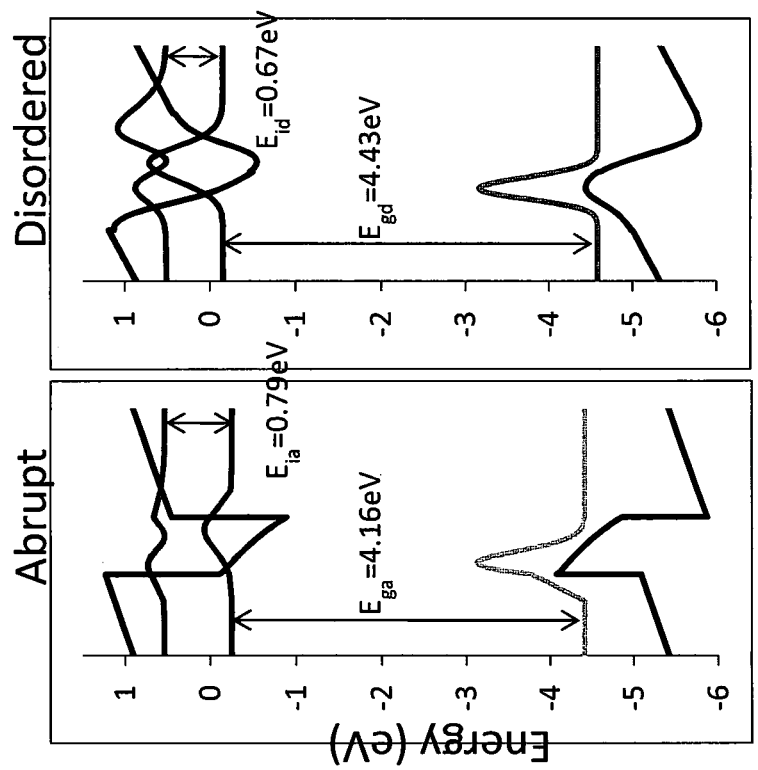
FIG. 5 is a graph of the energy band structure for a quantum well (QW) with abrupt interfaces (not disordered) and one with disordered interfaces.

The layer disordering changes the energy bands of the heterostructure. The result of this intermixing on a quantum well (QW) is shown FIG. 5. The calculated band diagrams show a QW with abrupt interfaces (not disordered) and one with disordered interfaces. The calculation is for a superlattice of 14 Å thick $Al_{0.1}Ga_{0.9}N$ QWs with 46 Å thick AlN barriers where only one QW is shown. The energy tilt in the bands versus distance is due to the polarization fields in the polar III-nitride material. The impurity-induced layer disordering grades the composition of the heterointerfaces changing the energy levels. The bandgap energy of the abrupt QW is less than the bandgap energy of the disordered QW ($E_{ga}<E_{gd}$). The intersubband (ISB) energy in the conduction band of the abrupt QW is greater than the disordered QW ($E_{ia}>E_{id}$). This shift to smaller intersubband energies (longer wavelengths) is also shown in FIG. 3. The resulting energy position of the disordered QW is shifted relative to the intact QW.

Figure 6:
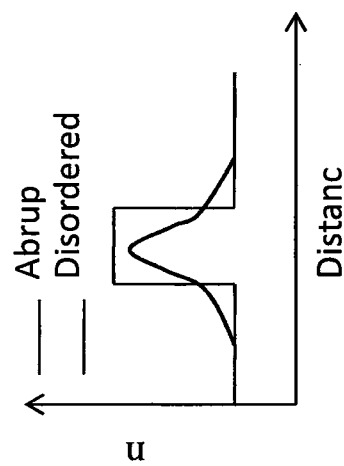
FIG. 6 is a graph of the optical index profile of a quantum well (QW) modified by IILD also changes the optical index profile of the QW.

IILD also changes the optical index profile of the QW. The QW shown in FIG. 5 has an optical index (n) profile roughly matching the one shown in FIG. 6 where the abrupt curve is before disordering and the disordered curve is after. The disordering grades the index and lowers the average index within the well. Therefore, IILD allows for control of the optical index.

The disordering described in III-nitrides above has been within the entire semiconductor structure. Selective disordering can be achieved by patterning an impurity layer on top of the semiconductor heterostructure layers and then diffusing the impurity into the semiconductor structure at elevated temperatures. Methods for selectively disordering include: 1) patterning an impurity layer, such as Mg or Si, by evaporation and wet etching, 2) implanting the dopant using photoresist as an implant mask layer, and 3) growing a highly doped cap layer and then patterning and etching this cap away where one does not want the IILD to occur. After these selectively patterning the impurity on the surface, it can be capped if necessary with a dielectric to protect from vacancy disordering. Then the whole sample can then be subjected to a high temperature anneal. The temperature can be chosen to effectively diffuse the impurity into the semiconductor structure down to the desired heterointerfaces, such as the quantum well in a light-emitting structure. Typical temperatures are >900° C. for Si.

Figure 7:
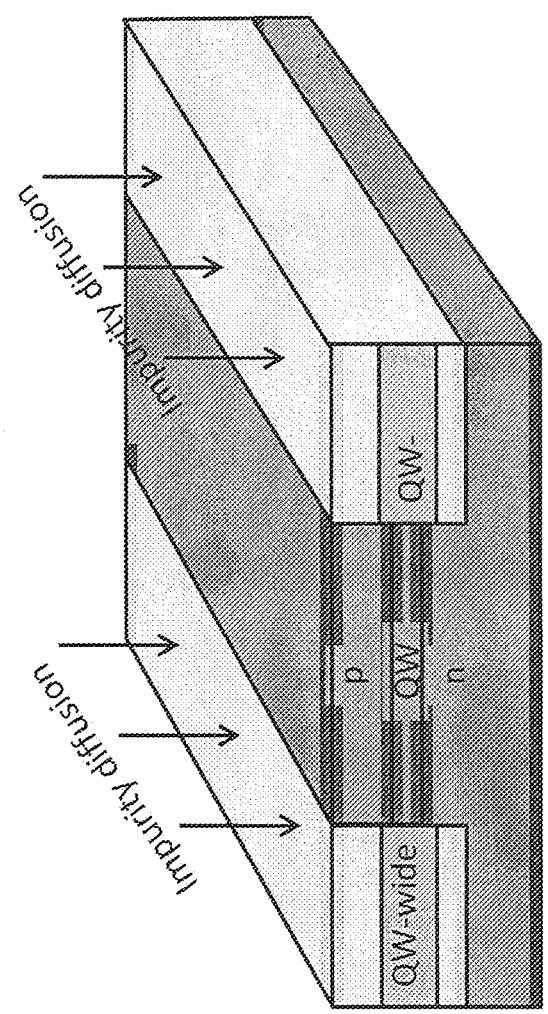
FIG. 7 is a schematic illustration of a device comprising a p-n junction made of wide-gap and lower index material sandwiching a QW with a narrower gap and higher index material that has an impurity patterned and diffused selectively from the surface.

Various new device structures can be made using impurity-induced disordering in III-nitride materials. An exemplary device structure is shown in FIG. 7 to illustrate how IILD can be used to create novel devices in III-nitrides. The exemplary device comprises p-n junction made of wide-gap and lower index material, made from an impurity patterned and diffused selectively from the surface, sandwiching a QW with a narrower gap and higher index material. IILD creates a wider-gap, lower index QW active region in the diffused areas creating a waveguide within the center stripe. IILD can also be useful for lasers. If the impurity used also creates n-type layers, then the stripe area also confines carrier injection where the top p-type contact will only make contact to the p-type layers. IILD can also be used at the facets of a III-nitride laser. IILD can prevent heating of the facets because current injection will be blocked. This can lower the heat generated at the facet and improve reliability. The waveguide created in this fashion can also be used in other opto-electronic devices, such as light-emitting diodes, photodetectors, solar cells, modulators, and amplifiers. Interfaces can also be graded in electrical devices, such as HBTs and HEMTs, using this method.

The present invention has been described as impurity induced disorder in III-nitride materials. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for impurity-induced layer disordering in III-nitride materials, comprising:
    growing a III-nitride heterostructure at a growth temperature chosen to prevent layer disordering
    and doping one or more of the heterostructure layers with an impurity during growth, and
    post-growth annealing the heterostructure at an annealing temperature, time, and carrier gas pressure that induces disorder of one or more the heterostructure layer interfaces.

2. The method of claim 1, wherein the III-nitride heterostructure comprises a plurality of AlGaN/AlN, GaN/AlN, GaN/AlGaN, InGaN/GaN, InGaN/AlN, InGaN/AlGaN, AlInN/GaN, AlInN/AlN, or AlInN/InGaN layers.

3. The method of claim 1, wherein the impurity comprises silicon, magnesium, selenium, or tellurium.

4. The method of claim 1, wherein the dopant concentration in the heterostructure is greater than $5 \times 10^{19}$ cm$^{-3}$.

5. The method of claim 1, wherein the growing comprises metal-organic vapor phase epitaxy, molecular beam epitaxy, or vapor phase epitaxy.

6. The method of claim 1, wherein the growth temperature is less than 885° C.

7. The method of claim 1, wherein the annealing temperature is greater than 700° C.

8. The method of claim 7, wherein the annealing temperature is greater than 1000° C.

9. The method of claim 1, wherein the carrier gas comprises $N_2$, $NH_3$, $H_2$, or He.

10. The method of claim 1, further comprising depositing a dielectric layer on a portion of the surface of the doped heterostructure prior to the post-growth annealing.

11. The method of claim 10, wherein the dielectric layer comprises SiN, SiON, or $SiO_2$.

\* \* \* \* \*